US012803532B2

(12) United States Patent
Al-Joumayly et al.

(10) Patent No.: US 12,803,532 B2
(45) Date of Patent: Nov. 17, 2026

(54) RECONFIGURABLE RADIO FREQUENCY (RF) FILTERING CIRCUITS

(71) Applicant: Qorvo US, Inc., Greensboro, NC (US)

(72) Inventors: Mudar Al-Joumayly, Casselberry, FL (US); Marcus Granger-Jones, Scotts Valley, CA (US); Nadim Khlat, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 237 days.

(21) Appl. No.: 18/509,733

(22) Filed: Nov. 15, 2023

(65) Prior Publication Data

US 2024/0186985 A1 Jun. 6, 2024

Related U.S. Application Data

(60) Provisional application No. 63/490,210, filed on Mar. 14, 2023, provisional application No. 63/385,707, filed on Dec. 1, 2022.

(51) Int. Cl.
*H03H 9/58* (2006.01)

(52) U.S. Cl.
CPC .................................... *H03H 9/58* (2013.01)

(58) Field of Classification Search
CPC ........................................................ H03H 9/58
See application file for complete search history.

(56) References Cited

U.S. PATENT DOCUMENTS

2003/0011443 A1* 1/2003 Liu .......................... H03H 7/38 333/32
2019/0036553 A1* 1/2019 Sugimoto ............ H04B 1/0057

* cited by examiner

*Primary Examiner* — Henry Luong
(74) *Attorney, Agent, or Firm* — Fish & Richardson P.C.

(57) ABSTRACT

A radio frequency (RF) filtering circuit is provided. The RF filtering circuit includes a common circuit having one or more first series resonators, and one or more first shunt resonators. The RF filtering circuit may also include a first branch circuit electrically connected to the common circuit, the first branch circuit having at least one of a second series resonator or a second shunt resonator. The RF filtering circuit may also include a second branch circuit electrically connected to the common circuit, the second branch circuit having at least one of a third series resonator or a third shunt resonator. The RF filtering circuit may also include one or more switches may be electrically connected to one of the first branch circuit or the second branch circuit. The first branch circuit is different from the second branch circuit.

10 Claims, 14 Drawing Sheets

(a)

(b)

RECONFIGURABLE RADIO FREQUENCY (RF) FILTERING CIRCUITS

CROSS REFERENCE(S)

The instant application is a nonprovisional of and claims priority under 35 U.S.C. 119 to U.S. provisional application No. 63/385,707, filed Dec. 1, 2022, and 63/490,210, filed Mar. 14, 2023, both of which are incorporated herein in their entireties.

FIELD OF THE INVENTION

This disclosure relates to radio frequency (RF) devices. In particular, this disclosure relates to reconfigurable RF filtering circuits.

BACKGROUND

Radio frequency (RF) filters, e.g., particularly acoustic wave resonators or filters, are used in high-frequency communication applications such as 3$^{rd}$ Generation (3G), 4$^{th}$ Generation (4G), and 5$^{th}$ Generation (5G) wireless devices. In particular, a RF filter is often employed to provide a flat passband, steep filter skirts, and squared shoulders at the upper and lower ends of the passband, and provide excellent rejection outside of the passband in a filter network. These wireless devices often support various communication means such as cellular, wireless fidelity (Wi-Fi), Bluetooth, and/or near field communications, and accordingly, high performance of the RF filters are needed.

For example, the continuous addition of new frequency bands or repurposing existing frequency bands in an already crowded spectrum, while maintaining co-existing condition, requires RF filter to achieve a very steep transition. The required filter steepness makes it difficult to achieve. To overcome this shortcoming, a filter bank with RF filters having different roll-offs/bandwidths is used. This results in a bulky and expensive solution, in addition to the increased loss since silicon (SOI) switches are needed at the input and output of the filter bank.

Therefore, there is a need to provide RF filters with smaller sizes, lower loss, and lower cost while maintaining the steep transition.

SUMMARY

Aspects of the disclosure include a radio frequency (RF) filtering circuit. The RF filtering circuit includes a common circuit having one or more first series resonators in series between an input terminal and an output terminal, and one or more first shunt resonators each electrically connected between a junction between the input terminal and the output terminal, and a common terminal. The RF filtering circuit may also include a first branch circuit electrically connected to the common circuit, the first branch circuit having at least one of a second series resonator or a second shunt resonator. The RF filtering circuit may also include a second branch circuit electrically connected to the common circuit, the second branch circuit having at least one of a third series resonator or a third shunt resonator. The RF filtering circuit may also include one or more switches that may be electrically connected to one of the first branch circuit or the second branch circuit. The first branch circuit is different from the second branch circuit.

In some embodiments, in response to the one or more switches being electrically coupled to the first branch circuit, the output terminal outputs a first frequency range. In some embodiments, in response to the one or more switches being electrically coupled to the second branch circuit, the output terminal outputs a second frequency range, the second frequency range being different from the first frequency range.

In some embodiments, the first branch circuit and the second branch circuit are each electrically connected to the common circuit at a third terminal between the input terminal and the output terminal.

In some embodiments, the one or more switches are positioned between the third terminal and the output terminal. The one or more switches may electrically connect the first branch circuit to the output terminal, or electrically connect the second branch circuit to the output terminal.

In some embodiments, the first branch circuit includes two second series resonators electrically connected between the output terminal and the third terminal, and one second shunt resonator electrically connected between a junction between the two second series resonators and a common inductor. In some embodiments, the second branch circuit includes two third series resonators electrically connected between the output terminal and the third terminal, and one third shunt resonator electrically connected between a junction between the two third series resonators and the common inductor.

In some embodiments, the first branch circuit corresponds to an upper skirt frequency of the first frequency range; and the second branch circuit corresponds to an upper skirt frequency of the second frequency range. The upper skirt frequencies of the first frequency range and the second frequency range are different from one another.

In some embodiments, the first frequency range and the second frequency range at least partially overlap with each other.

In some embodiments, the first branch circuit includes a second shunt resonator electrically connected to the common circuit at a third terminal, and another second shunt resonator electrically connected to the common circuit at a fourth terminal. The second shunt resonator is different from the other second shunt resonator. The second branch circuit includes a third shunt resonator electrically connected to the common circuit at the third terminal, and another third shunt resonator electrically connected to the common circuit at the fourth terminal, the third shunt resonator being different from the other third shunt resonator.

In some embodiments, the one or more switches includes a first switch and a second switch positioned between the input terminal and the output terminal. In response to the one or more switches being electrically coupled to the first branch circuit, the first switch electrically connects the second shunt resonator with a first inductor, and the second switch electrically connects the other second shunt resonator with a second inductor. In response to the one or more switches being electrically coupled to the second branch circuit, the first switch electrically connects the third shunt resonator with the first inductor, and the second switch electrically connects the other third shunt resonator with the second inductor.

In some embodiments, the first branch circuit corresponds to a lower skirt frequency of the first frequency range; and the second branch circuit corresponds to a lower skirt frequency of the second frequency range. The lower skirt frequencies of the first frequency range and the second frequency range are different from one another.

In some embodiments, the first frequency range and the second frequency range at least partially overlap with each other.

In some embodiments, the one or more switches and the output terminal are part of an antenna. The first branch circuit includes one second series resonator electrically connected to the common circuit at a third terminal. The second branch circuit includes one third series resonator electrically connected to the common circuit at the third terminal. The second series resonator is different from the third series resonator such that a first loading impedance of the first branch circuit is different from a second loading impedance of the second branch circuit.

In some embodiments, the one or more switches are positioned between the third terminal and the input terminal. The one or more switches may electrically connect the input terminal to the first branch circuit, or electrically connect the input terminal to the second branch circuit. The output terminal is an input of a multiplexer.

In some embodiments, the first branch circuit includes one second series resonator electrically connected to the common circuit at the third terminal, and the second branch circuit includes one third series resonator electrically connected to the common circuit at the third terminal. The second series resonator is different from the third series resonator such that a first loading impedance of the first branch circuit is different from a second loading impedance of the second branch circuit.

In some embodiments, the first loading impedance and the second loading impedance and each matches a respective filter in the multiplexer.

In some embodiments, the one or more first series resonators, one or more first shunt resonators, the at least one of a second series resonator or a second shunt resonator, and the at least one of a third series resonator or a third shunt resonator include at least one of a bulk acoustic wave (BAW) resonator or a surface acoustic wave (SAW) resonator.

Aspects of the disclosure include a RF filtering device. The RF filtering device includes a RF filter that includes a common circuit having one or more first series resonators in series between an input terminal and an output terminal, and one or more first shunt resonators each electrically connected between the input terminal and the output terminal, and a common terminal. The RF filter device also includes a first branch circuit electrically connected to the common circuit, the first branch circuit having a second series resonator. The RF filtering device also includes a second branch circuit electrically connected to the common circuit, the second branch circuit having a third series resonator. The RF filtering device also includes a first multiplexer having a second output terminal, a second multiplexer having a third output terminal, and an antenna having a switch and being electrically coupled to the output terminal of the RF filter, the first multiplexer, and the second multiplexer. In response to the switch being electrically coupled to the first branch circuit, the RF filter is multiplexed with the first multiplexer. In response to the switch being electrically coupled to the second branch circuit, the RF filter is multiplexed with the second multiplexer.

In some embodiments, a first loading impedance of the first branch circuit matches that of the first multiplexer, and a second loading impedance of the second branch circuit matches that of the second multiplexer.

Aspects of the present disclosure provide a RF filtering device. The RF filtering device includes a first RF filter that includes a first common circuit having one or more first series resonators in series between a first input terminal and a first output terminal, and one or more first shunt resonators each electrically connected between a junction between the first input terminal and the first output terminal, and a common terminal. The first RF filter also includes a first branch circuit electrically connected to the first common circuit at a first terminal between the first input terminal and the first output terminal, the first branch circuit having at least one of a second series resonator or a second shunt resonator. The first RF filter also includes a second branch circuit electrically connected to the first common circuit at the first terminal, the second branch circuit having at least one of a third series resonator or a third shunt resonator. The first RF filter also includes a first switch being electrically connecting one of the first branch circuit or the second branch circuit to the first output terminal. The RF filtering device also includes a second RF filter that includes a second common circuit having one or more fourth series resonators in series between a second input terminal and a second output terminal, and one or more fourth shunt resonators each electrically connected between the second input terminal and the second output terminal, and a common terminal. The second RF filter also includes a third branch circuit having a fifth shunt resonator electrically connected to the second common circuit at a second terminal, and another fifth shunt resonator electrically connected to the second common circuit at a third terminal, the fifth shunt resonator being different from the other fifth shunt resonator. The second RF filter also includes a fourth branch circuit having a sixth shunt resonator electrically connected to the second common circuit at the second terminal, and another sixth shunt resonator electrically connected to the second common circuit at the third terminal, the sixth shunt resonator being different from the other sixth shunt resonator. The second RF filter also includes an antenna electrically connected to the first output terminal and the second output terminal.

In some embodiments, the first branch circuit and the second branch circuit respectively corresponds to a first upper skirt frequency and a second upper skirt frequency of a first frequency range, the first upper skirt frequency being different from the second upper skirt frequency. The third branch circuit and the fourth branch circuit may respectively correspond to a first lower skirt frequency and a second lower skirt frequency of a second frequency range, the first lower skirt frequency being different from the second lower skirt frequency. The antenna may output one of the first frequency range having the first upper skirt frequency, the first frequency range having the second upper skirt frequency, the second frequency range having the first lower skirt frequency, or the second frequency range having the second lower skirt frequency.

DETAILED DESCRIPTION

Figure 1A:
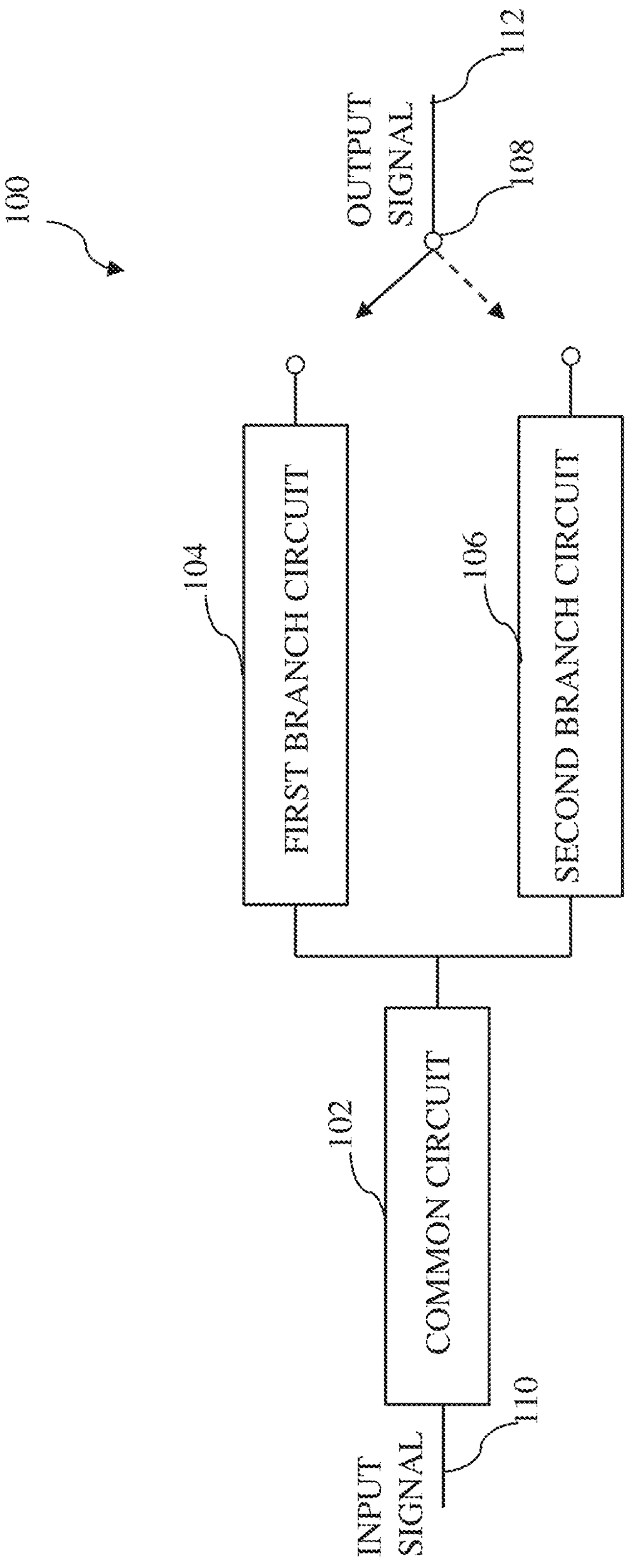
FIG. 1A illustrates a block diagram of an exemplary configuration of a RF filtering circuit, according to some embodiments of the present disclosure.

The following detailed description is illustrative in nature and is not intended to limit the scope, applicability, or configuration of inventive embodiments disclosed herein in any way. Rather, the following description provides practical examples, and those skilled in the art will recognize that some of the examples may have suitable alternatives. Embodiments will hereinafter be described in conjunction with the appended drawings, which are not to scale (unless so stated), wherein like numerals/letters denote like elements. However, it will be understood that the use of a number to refer to a component in a given drawing is not intended to limit the component in another drawing labeled with the same number. In addition, the use of different numbers to refer to components in different drawings is not intended to indicate that the different numbered components cannot be the same or similar to other numbered components. Examples of constructions, materials, dimensions and fabrication processes are provided for select elements and all other elements employ that which is known by those skilled in the art.

As used herein, the term "about" refers to a given amount of value that may vary based on the particular technology node associated with the semiconductor device. Based on a particular technology node, the term "about" can refer to a given amount of value that varies, for example, within 10-30% of the value (e.g., ±10%, ±20%, or ±20% of that value, or ±30%).

Reference will now be made in greater detail to various embodiments of the subject matter of the present disclosure, some embodiments of which are illustrated in the accompanying drawings.

As previously described, the co-existence of more frequency bands (e.g., new frequency bands or repurposed frequency bands) results in a need for RF filters capable of quicker and steeper transitions between two frequency bands without sacrificing the size and cost. In addition to the co-exist requirement, there is a continuous demand for higher bandwidth. Carrier aggregation (CA) is used to meet this demand through multiplexing, to use filter bandwidths simultaneously. For example, in highly integrated modules, at least 20 filters are used with different multiplexing configurations. This means that a single band can be connected to one RF filter (e.g., a hexaplexer) in one CA case, or to another RF filter (e.g., a quadplexer) in another CA case. Designing a single RF filter capable of operating in all these cases is very challenging because it requires the RF filter to cope with a different multiplexer (MUX) loading impedance in each case. To overcome this challenge, multiple RF filters and switches are often used. Each of these RF filters is designed for a specific MUX loading impedance, and is turned on and off by a respective switch. The use of multiple RF filters and switches can result in higher cost, higher losses, and slower responses.

Embodiments of the present disclosure provide reconfigurable RF filtering circuits for tuning frequency ranges and loading impedances without sacrificing transition speed, transition steepness, size, and cost. The proposed reconfigurable filtering circuit addresses the challenges aforementioned and provides the flexibility to adjust the roll-off of the output frequency range and meet stringent rejection requirement, and/or adjust its effective capacitance and MUX loading presented to other RF filters. The RF filtering circuit can meet the required performance while using fewer components with lower cost and smaller sizes. In the present disclosure, a reconfigurable RF filtering circuit includes a common circuit and a plurality of branch circuits coupled to the common circuit. One or more switches may electrically couple one of the branch circuits to the common circuit in operation. Each branch circuit corresponds to a different frequency range and/or loading impedance. In operation, only one of the branch circuit is electrically connected to the common circuit, forming a RF filter. The RF filter can output a frequency range (e.g., a pass-band) and/or have a loading (capacitive) impedance. The output of the RF filtering circuit may be the input of an antenna and/or a multiplexer. By adjusting/optimizing the resonators in branch circuits, each branch circuit may output a respective frequency range and/or a loading impedance. For example, the resonating area and/or frequency of a resonator may be optimized such that the corresponding RF filter outputs a desired frequency range and/or loading impedance for a desired application. In some embodiments, the series resonators in the branch circuits are adjusted for tuning the upper skirt frequency of the output frequency range. In some embodiments, the shunt resonators in the branch circuits are adjusted for tuning the lower skirt frequency of the output frequency range.

The RF filtering circuit may be employed in different applications. In an example, the RF filtering circuit may be used to tune the upper and/or lower skirt frequency of the output frequency range (e.g., a frequency pass-band). In an example, the RF filtering circuit may be used to tune the width of a frequency stop-band in a notch filter. In another example, the RF filtering circuit may also be used to match different loading impedances to a plurality of multiplexers when the multiplexers are electrically connected to an antenna. In a further example, the RF filtering circuit is multiplexed with a multiplexer for matching the loading impedance before the multiplexer is electrically connected to an antenna. Depending on the application, an input signal may be received by the common circuit or a selected branch circuit, and an output signal of the RF filtering circuit may be outputted by the selected branch circuit or the common circuit.

The disclosed RF filtering circuit can be employed to flexibly tune the upper/lower skirt frequency and loading impedance with less components. Compared to an existing RF filter that requires multiple RF filters each accompanied by a switch for a respective frequency range/loading impedance, the disclosed RF filtering circuit requires fewer RF filters (e.g., only one RF filter in operation) and fewer switches (e.g., only one or more for switching on a branch circuit in operation). The RF filtering circuit may thus have a smaller size, lower losses, lower cost, and higher transition speed.

FIG. 1A illustrates a configuration of an exemplary RF filtering circuit 100 (e.g., a reconfigurable RF filtering circuit), according to some embodiments. As shown in FIG. 1A, RF filtering circuit 100 may include a common circuit 102, a first branch circuit 104 coupled to common circuit 102, and a second branch circuit 106 coupled to common circuit 102. First branch circuit 104 and second branch circuit 106 may be coupled to common circuit 102 at the same terminal. RF filtering circuit 100 may also include a switch 108 for selecting first branch circuit 104 or second branch circuit 106 such that the selected branch circuit is electrically connected to common circuit 102 in operation. In various embodiments, depending on the design, switch 108 may include one or more switches. RF filtering circuit 100 may also include an input terminal 110 coupled to common circuit 102 at another terminal, and an output terminal 112 coupled to switch 108. Switch 108 may be positioned between the branch circuits (e.g., 104 and 106) and output terminal 112. In operation, switch 108 may electrically connect output terminal 112 and one of first branch circuit 104 and second branch circuit 106. In operation, common circuit 102 may receive an input signal at input terminal 110. In some embodiments, the input signal is from a transmitter. The input signal may be processed by common circuit 102 and the selected branch circuit (e.g., first branch circuit 104 or second branch circuit 106). Output terminal 112 may then output an output signal through switch 108. In various embodiments, the input signal and the output signal may include various suitable signals such as electrical signals, acoustic signals, magnetic signals, optical signals, or a combination thereof.

Common circuit 102 and first branch circuit 104, when electrically connected, may form a first RF filter. Common circuit 102 and second branch circuit 106, when electrically connected, may form a second RF filter. First RF filter (or first branch circuit 104) and second RF filter (or second branch circuit 106) may correspond to (e.g., output) different frequency ranges and/or different impedance loadings. In some embodiments, the first RF filter and the second RF filter may respectively output a first frequency range and a second frequency range. The first frequency range and the second frequency range may partially overlap with each other. In some embodiments, the first and second frequency ranges may have different lower skirt frequencies. In some embodiments, the first and second frequency ranges may have different upper skirt frequencies. In some embodiments, the first and second frequency ranges have the same lower skirt frequency but different upper skirt frequencies, and vice versa.

Figure 1B:
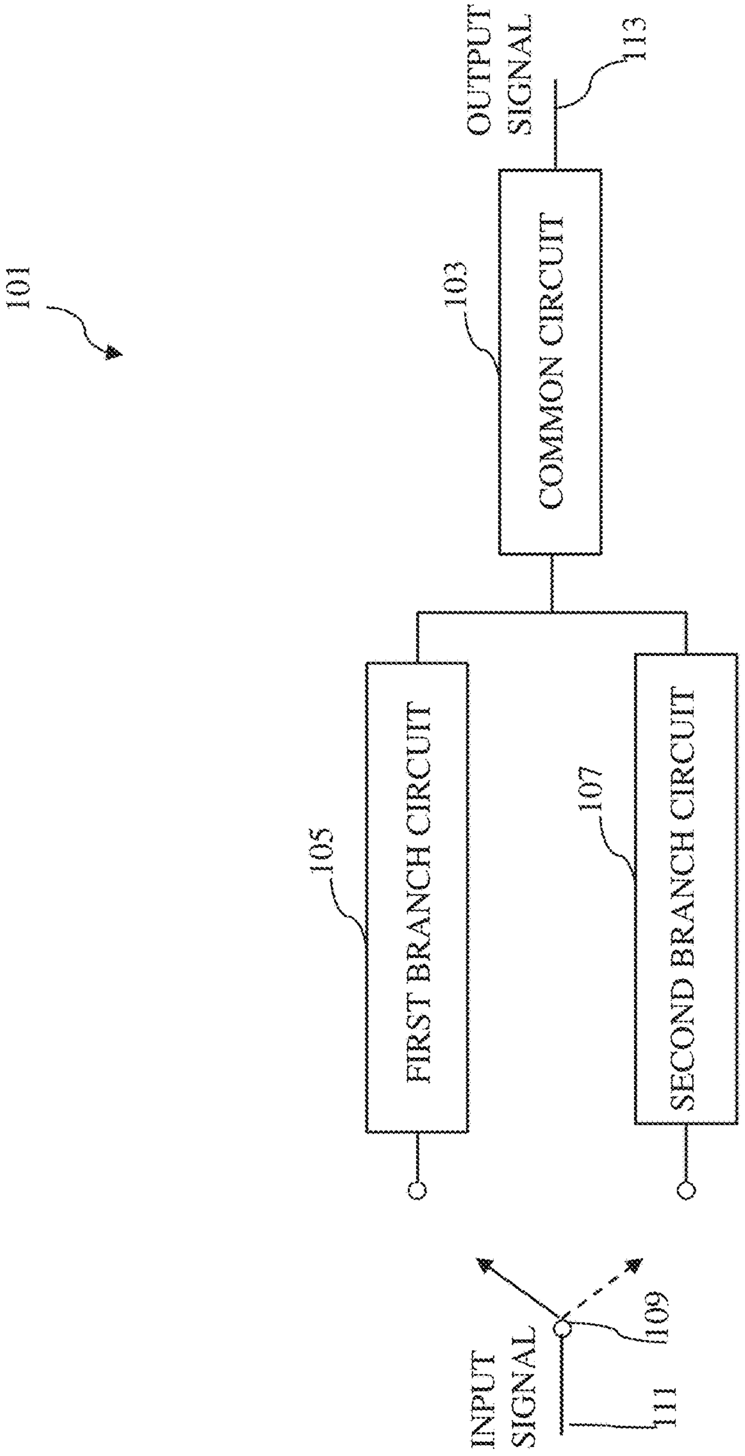
FIG. 1B illustrates a block diagram of another exemplary configuration of a reconfigurable RF filtering circuit, according to some embodiments of the present disclosure.

FIG. 1B illustrates a configuration of another exemplary RF filtering circuit 101 (e.g., a reconfigurable RF filtering circuit), according to some embodiments. As shown in FIG. 1B, RF filtering circuit 101 may include a common circuit 103, a first branch circuit 105 coupled to common circuit 103, and a second branch circuit 107 coupled to common circuit 103. First branch circuit 105 and second branch circuit 107 may be coupled to common circuit 103 at the same terminal. RF filtering circuit 101 may also include a switch 109 for selecting first branch circuit 105 or second branch circuit 107 such that the selected branch circuit is electrically connected to common circuit 103 in operation. In various embodiments, depending on the design, switch 109 may include one or more switches. RF filtering circuit 101 may also include an input terminal 111 coupled to switch 109 for receiving an input signal, and an output terminal 113 coupled to common circuit 103 for outputting an output signal. In some embodiments, the input signal is from a transmitter.

Different from RF filtering circuit 100, switch 109 may be positioned between input terminal 111 and the branch circuits (e.g., first branch circuit 105 and second branch circuit 107). In operation, switch 109 may electrically connect input terminal 111 and one of first branch circuit 105 and second branch circuit 107. The selected branch circuit (e.g., first branch circuit 105 or second branch circuit 107) may receive an input signal through switch 109. The input signal may be processed by the selected branch circuit (e.g., first branch circuit 105 or second branch circuit 107) and common circuit 103. Output terminal 113 may then output the output signal from common circuit 103. In various embodiments, the input signal and the output signal may include various suitable signals such as electrical signals, acoustic signals, magnetic signals, optical signals, or a combination thereof.

Common circuit 103 and first branch circuit 105, when electrically connected, may form a first RF filter. Common circuit 103 and second branch circuit 107, when electrically connected, may form a second RF filter. First RF filter (or first branch circuit 105) and second RF filter (or second branch circuit 107) may correspond to (e.g., output) different frequency ranges and/or different impedance loadings. In some embodiments, the first RF filter and the second RF filter may respectively output a first frequency range and a second frequency range, while the first frequency range and the second frequency range may at least partially overlap with each other. In some embodiments, the first and second frequency ranges may have different lower skirt frequencies. In some embodiments, the first and second frequency ranges may have different upper skirt frequencies. In some embodiments, the first and second frequency ranges have the same lower skirt frequency but different upper skirt frequencies, and vice versa.

Figure 1C:
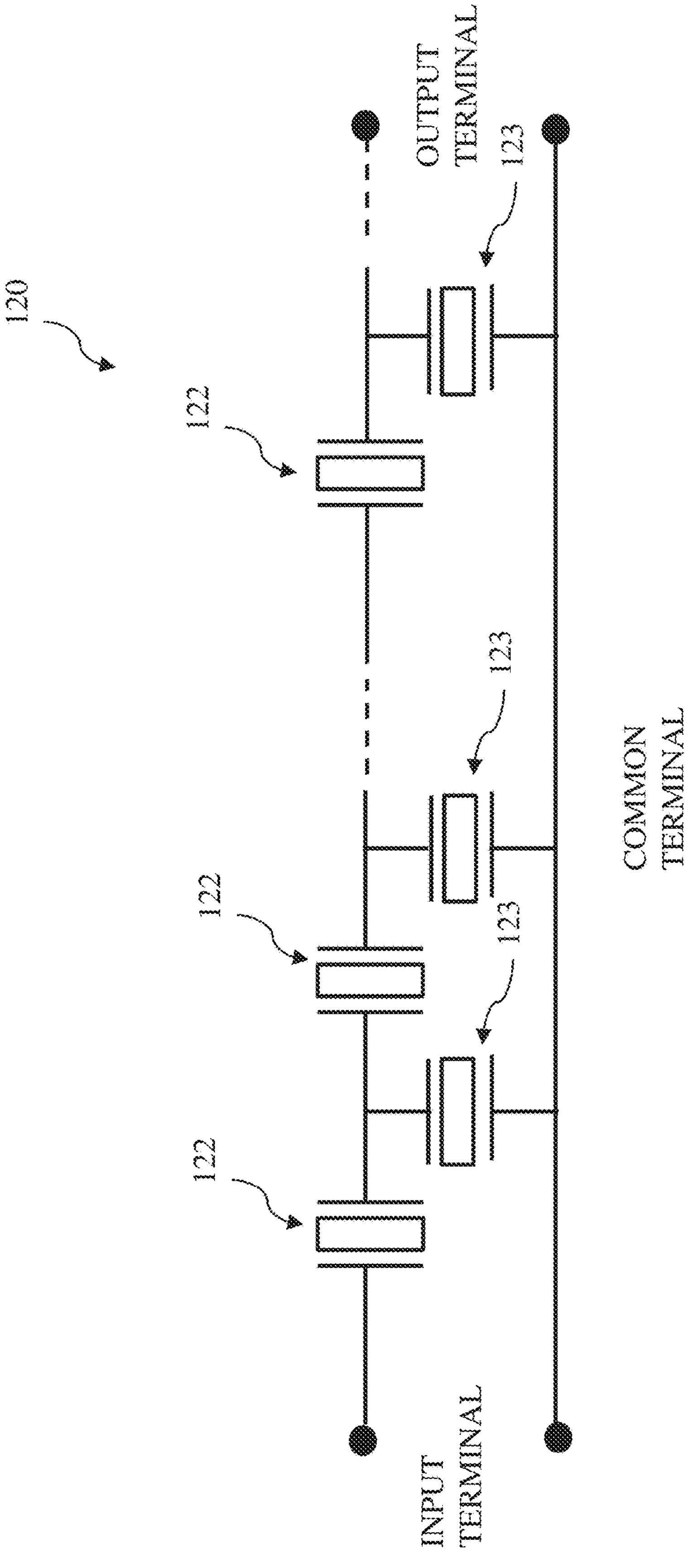
FIG. 1C illustrates resonators in a RF filtering circuit.

FIG. 1C illustrates resonators in a filtering circuit 120. Filtering circuit 120 includes one or more series resonators 122 and one or more shunt resonators 123. In this present disclosure, each series resonator (e.g., series resonator 122) and each shunt resonator (e.g., shunt resonator 123) can be a single resonator or one or more resonators on the same frequency connected in series or parallel. Series resonators 122 may be electrically connected in series between an input terminal and an output terminal of filtering circuit 120. Shunt resonators 123 may each be electrically connected between a junction between the input terminal and the output terminal, and a common terminal. Each series resonator 122 may be the same as or different from another series resonator 122, and each shunt resonator 123 may be the same as or different from another shunt resonator 123. In some embodiments, series resonators 122 may have the same frequency and/or resonating area, or different frequencies and/or resonating areas. In some embodiments, shunt resonators 123 may have the same frequency and/or resonating area, or different frequencies and/or resonating areas. In some embodiments, at least one of series resonator 122 and shunt resonator 123 includes a bulk acoustic wave (BAW) resonator. In some embodiments, at least one of series resonator 122 and shunt resonator 123 includes a surface acoustic wave (SAW) resonator. For example, series resonators 122 and shunt resonators 123 may include all BAW resonators, all SAW resonators, or all a combination of SAW resonators and BAW resonators. In some embodiments, filtering circuit 120 is also referred to as a ladder filter circuit.

In some embodiments, RF filtering circuit 100 and 101 may each include part or the entirety of filtering circuit 120. For example, RF filtering circuit 100 and 101 may each include one or more series resonators and/or one or more shunt resonators in the common circuit and/or a branch circuit.

Figure 1D:
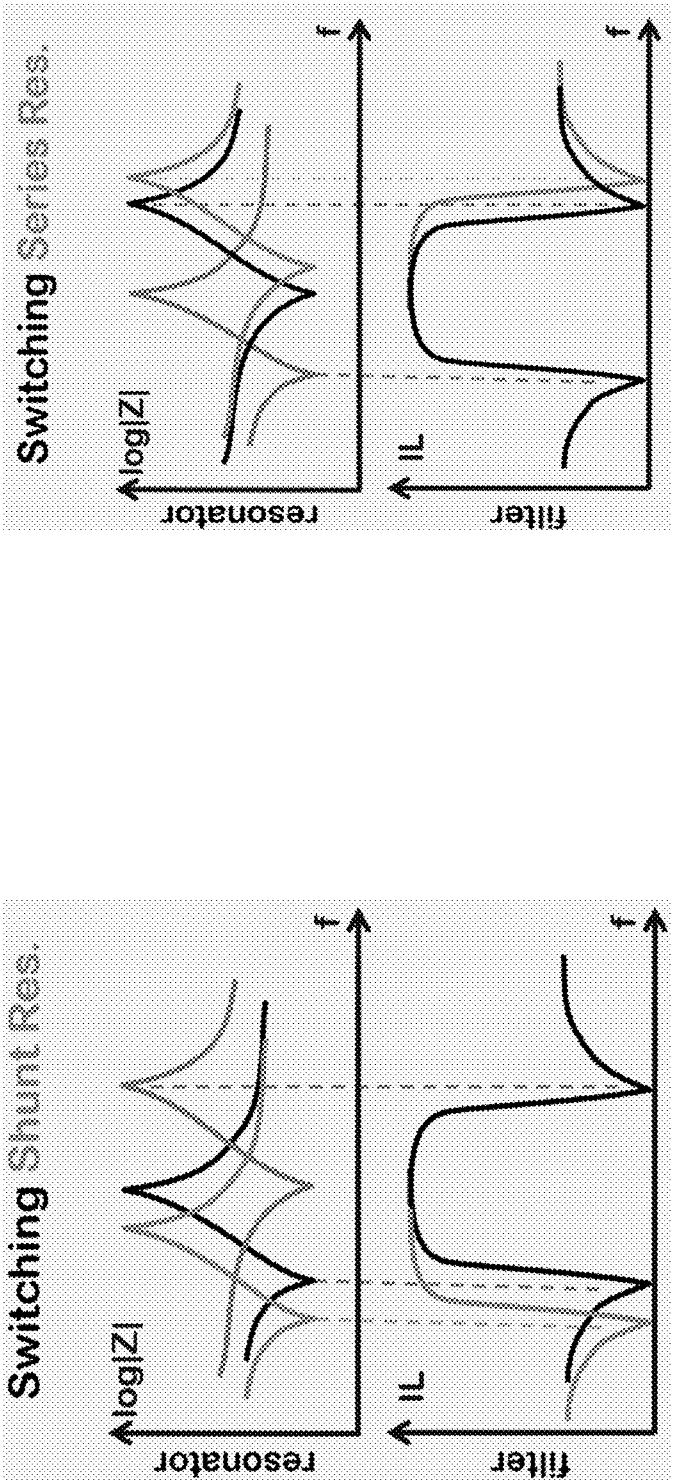
FIG. 1D illustrates electrical properties and transmission responses in RF filtering circuits by adjusting series resonators and shunt resonators, respectively, according to some embodiments of the present disclosure.

FIG. 1D illustrates electrical properties and transmission responses of a RF filtering circuit as functions of frequencies, according to some embodiments. The RF filtering circuit may be an example of RF filtering circuit 100 or 101. In FIG. 1D, (a) shows the impedance (log |Z|) and transmission response (IL) of the RF filtering circuit by switching amongst different shunt resonators with different resonating areas and/or frequencies (e.g., trimming frequencies), (b) shows the impedance (log |Z|) and transmission response (IL) of the RF filtering circuit by switching amongst different series resonators with different resonating areas and/or frequencies (e.g., trimming frequencies). In some embodiments, the lower skirt frequency of a frequency range (e.g., a pass-band) can be adjusted by switching amongst shunt resonators, and the upper skirt frequency of a frequency range can be adjusted by switching amongst series resonators. In some embodiments, a loading impedance of the RF filtering circuit can be changed by switching amongst shunt resonators and/or series resonators.

Figure 2A:
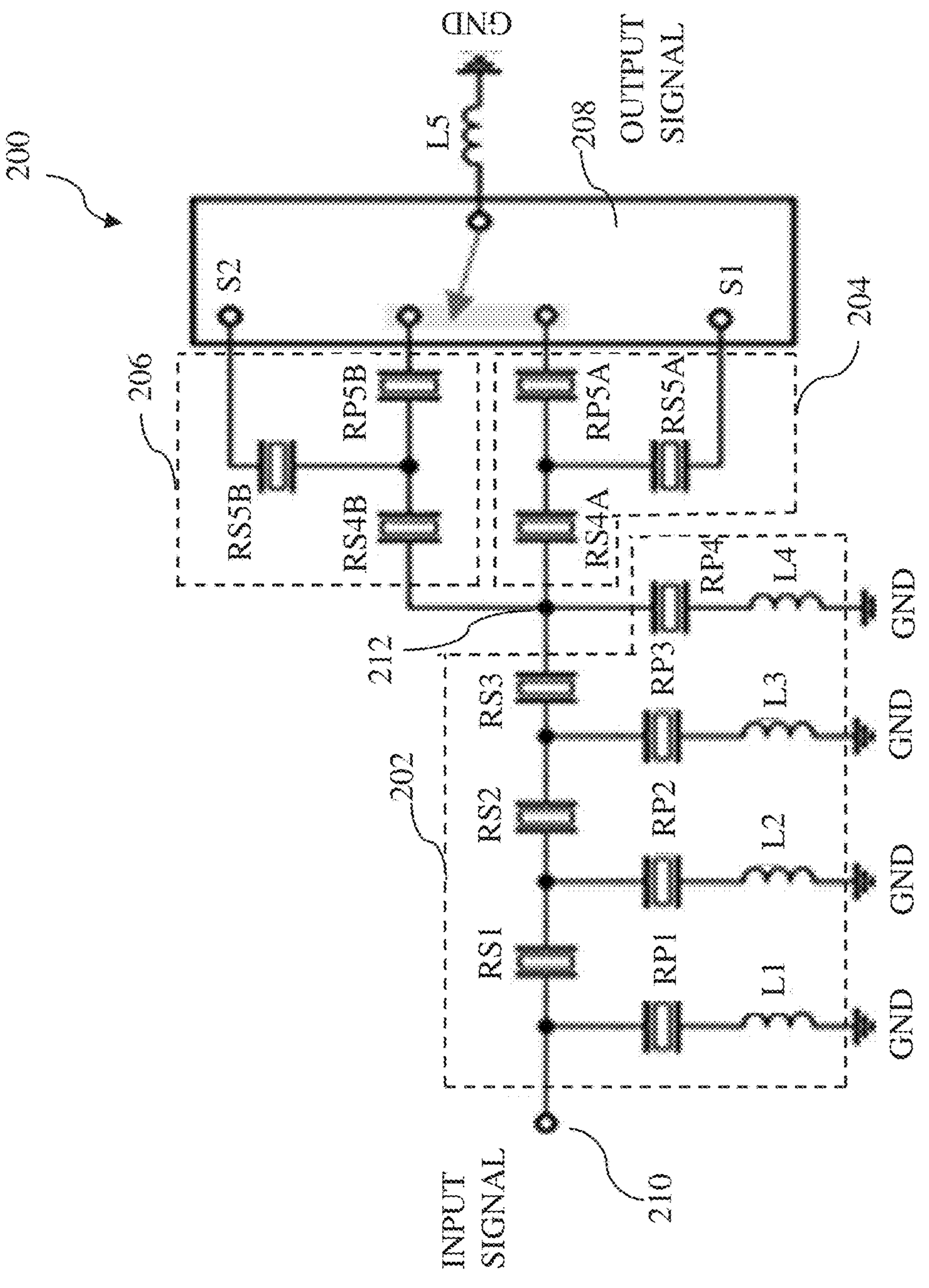
FIG. 2A illustrates an exemplary reconfigurable RF filtering circuit, according to some embodiments of the present disclosure.

FIG. 2A illustrates an exemplary RF filtering circuit 200 (e.g., a reconfigurable RF filtering circuit), according to some embodiments. RF filtering circuit 200 may have the configuration of RF filtering circuit 100. As shown in FIG. 2A, RF filtering circuit 200 may include a common circuit 202, a first branch circuit 204, a second branch circuit 206, and a switch. A first terminal 210 of common circuit 202 may be an input terminal of RF filtering circuit 200, and a second terminal 212 of common circuit 202 may be coupled to first branch circuit 204 and second branch circuit 206. First and second branch circuits 204 and 206 may each be coupled to an antenna 208, which includes the switch (not shown) that can electrically connect the output of one of first and second branch circuits 204 and 206 to the output port of antenna, which serves as the output of RF filtering circuit 200. RF filtering circuit 200 may also include a common inductor L5 that is electrically coupled to the selected one of first and second branch circuits 204 and 206 in operation. L5 may be grounded.

Common circuit 202 may include at least one series resonator connected in series between first terminal 210 and second terminal 212. In some embodiments, common circuit 202 may include series resonators RS1, RS2, and RS3 connected in series. In some embodiments, common circuit 202 includes shunt resonators RP1, RP2, RP3, and RP4, each respectively connected to a junction between first terminal 210 and second terminal 212, and ground. For example, shunt resonator RP1 may be connected between a junction coupled to first terminal 210 and ground, shunt resonator RP2 may be connected between a junction between series resonators RS1 and RS2 and ground, shunt resonator RP3 may be connected between a junction between series resonators RS2 and RS3 and ground, and shunt resonator RP4 may be connected between second terminal 212 and ground. In some embodiments, common circuit 202 includes inductors L1, L2, L3, and L4 respectively connected to shunt resonators RP1, RP2, RP3, and RP4, and ground.

First branch circuit 204 may include two series resonators RS4A and RS5A connected in series between an input terminal of first branch circuit 204 (e.g., second terminal 212 of common circuit 202) and an output terminal of first branch circuit 204 (e.g., the terminal coupled to antenna 208). First branch circuit 204 may also include a shunt resonator RP5A connected to a junction between series resonators RS4A and RS5A at a first terminal. A second terminal of shunt resonator RP5A may be configured to be connected to common inductor L5 when first branch circuit 204 is selected.

Second branch circuit 206 may include two series resonators RS4B and RS5B connected in series between an input terminal of second branch circuit 206 (e.g., second terminal 212 of common circuit 202) and an output terminal of second branch circuit 206 (e.g., the terminal coupled to antenna 208). Second branch circuit 206 may also include a shunt resonator RP5B connected to a junction between series resonators RS4B and RS5B at a first terminal. A second terminal of shunt resonator RP5B may be configured to be connected to common inductor L5 when second branch circuit 204 is selected.

First branch circuit 204 and second branch circuit 206 may correspond to different frequency ranges (or frequencies). The frequencies and/or resonating areas of the resonators in first branch circuit 204 and second branch circuit 206 may be adjusted/optimized to satisfy the frequency ranges/loading impedance of first and second branch circuits 204 and 206. In operation, the switch in antenna 208 may electrically connect the output terminal of one of first and second branch circuits 204 and 206, and common inductor L5 may be connected to the shunt resonator (e.g., RP5A or RP5B) of the selected branch circuit (e.g., first branch circuit 204 or second branch circuit 206). An input signal may be received at first terminal 210 of common circuit 202, and may be processed by common circuit 202 and the selected branch circuit (e.g., first branch circuit 204 or second branch circuit 206). In some embodiments, the input signal is from a transmitter. An output signal may be outputted to antenna 208 by the output terminal of the selected branch circuit (e.g., first branch circuit 204 or second branch circuit 206). For example, an output signal S1 is outputted to antenna 208 if first branch circuit 204 is selected, and an output signal S2 is outputted to antenna 208 if second branch circuit 206 is selected.

Figure 2B:
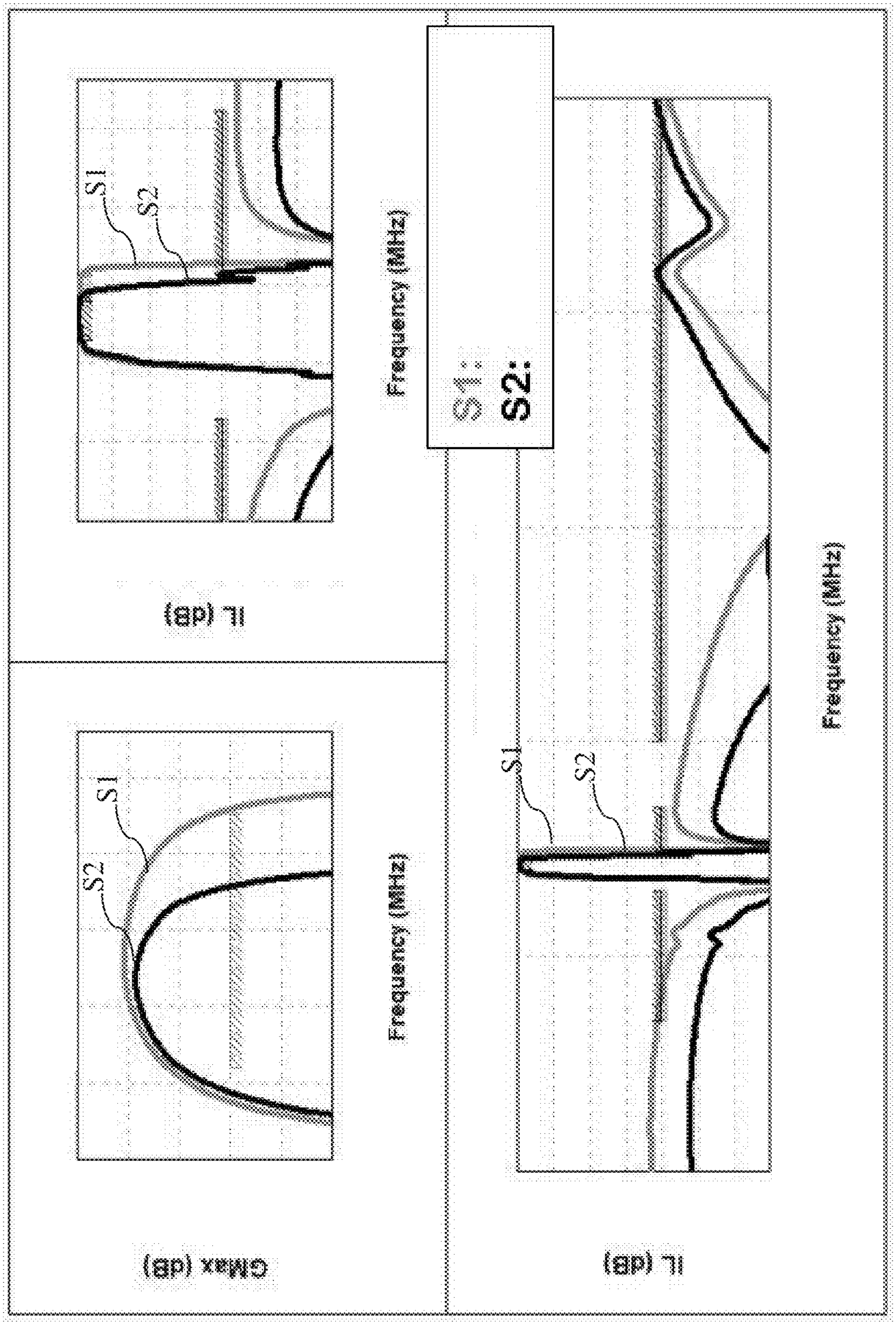
FIG. 2B illustrates transmission responses of the RF filtering circuit shown in FIG. 2A, according to some embodiments of the present disclosure.

Common circuit 202 may form a RF filter with each one of first and second branch circuits 204 and 206. For example, when first branch circuit 204 is selected, common circuit 202 and first branch circuit 204 may form a first RF filter, which outputs a first frequency range (e.g., as output signal S1). When second branch circuit 206 is selected, common circuit 202 and second branch circuit 206 may form a second RF filter, which outputs a second frequency range (e.g., as output signal S2). In some embodiments, the first frequency range and the second frequency range may overlap and may have different upper skirt frequencies. FIG. 2B illustrates exemplary transmission responses of RF filtering circuit 200 as functions of frequencies. As shown in FIG. 2B, the upper skirt frequency of the first frequency range (e.g., as output signal S1) and the upper skirt frequency of second frequency range (e.g., as output signal S2) may be different. In various embodiments, the resonating areas and/or frequencies of the resonators in RF filtering circuit 200 (e.g., first and second branch circuits 204 and 206) can be adjusted/optimized to obtain a desirable separation between the upper skirt frequencies of first and second frequency ranges. In operation, first branch circuit 204 and second branch circuit 206 may be selected (e.g., turned on or off) based on the frequency coverage and/or loading impedance desired for the application.

It should be noted that, RF filtering circuit 200 is merely an example to show the impact of switching series resonators in different branch circuits on the upper skirt frequencies, and is not meant to limit the number and electrical connections in a branch circuit or a common circuit. In various embodiments, a RF filtering circuit similar to RF filtering circuit 200 (e.g., having the configuration of RF filtering circuit 100) may have a different number of branch circuits, and each branch circuit may have a different number of series resonators than RF filtering circuit. The similar RF filtering circuit may also be configured to adjust the upper skirt frequencies and/or loading impedance at the output terminal by switching amongst different branch circuits with different series resonators (e.g., corresponding to different frequencies, having different resonating areas, etc.). The specific number of branch circuits may be determined based on the tuning range of the output frequency range and is not limited by the embodiments of the present disclosure.

Figure 2C:
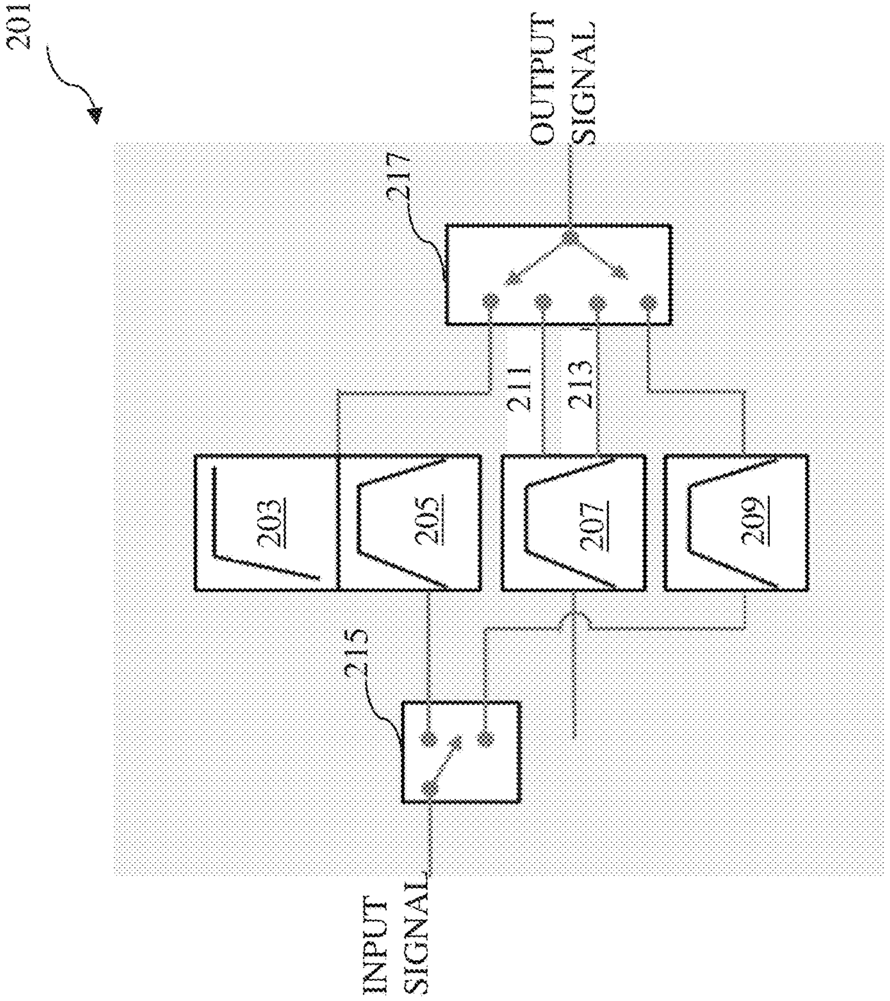
FIG. 2C illustrates a RF device implemented with an exemplary reconfigurable RF filtering circuit, according to some embodiments of the present disclosure.

RF filtering circuit 200 or the like may be employed in an RF filtering device to enable multiplexing of frequency ranges (e.g., bands) next to each other with little or no frequency separation. For example, RF filtering circuit 200 may switch the output between a frequency range and a reduced frequency range to create sufficient frequency separation between the two frequency ranges being multiplexed. FIG. 2C illustrates an exemplary RF filtering device 201 having a RF filtering circuit 207, according to some embodiments. RF filtering circuit 207 may be similar to RF filtering circuit 200 and may have a configuration of RF filtering circuit 100. For example, RF filtering circuit 207 may have a common circuit coupled to a first branch circuit and a second branch circuit. In operation, the common circuit may receive an input, while one of the first and second branch circuits may output an output signal. In an example, RF filtering circuit 207 may have the same configuration as RF filtering circuit 200. As shown in FIG. 2C, RF filtering device 201 may also include a RF filter 203, a RF filter 205, and a RF filter 209. In some embodiments, each of RF filters 203 and 205 output a single frequency range (e.g., a pass-band), and RF filter 209 outputs two frequency ranges (e.g., two pass-bands). RF filtering device 201 may include a first switch 215 to couple an input signal from an input terminal of RF filtering device 201 to one or more of the RF filters 203, 205, and 209 and/or RF filtering circuit 207. In some embodiments, the input signal is from a transmitter. RF filtering device 201 may also include a second switch 217 to couple an output signal from one or more of the RF filters 203, 205, and 209, and/or RF filtering circuit 207 to the output terminal of RF filtering device 201. In some embodiments, RF filtering device 201 is a multiplexer.

In operation, RF filtering circuit 207 may output a first frequency range 211 or a second frequency range 213. In some embodiments, first frequency range 211 and second frequency range 213 have the same lower skirt frequency, and different upper skirt frequencies. For example, the upper skirt frequency of first frequency range 211 is higher than the upper skirt frequency of second frequency range 213. In some embodiments, the lower skirt frequencies of first frequency range 211 and second frequency range 213 may also be different.

In various embodiments, RF filtering circuit 207 may need to be multiplexed with RF filters 203 and 205, or multiplexed with RF filter 209, for different applications. In some embodiments, RF filters 203 and 205 may output frequency ranges that have sufficient separation from first frequency range 211 such that RF filters 203 and 205 can be multiplexed with RF filtering circuit 207 when RF filtering circuit 207 outputs first frequency range 211. In some embodiments, the upper skirt frequency of first frequency range 211 is the same as (e.g., overlaps with) the lower skirt frequency of the output frequency range of RF filter 209. Because there is little/no separation between the upper skirt frequency of first frequency range 211 and the lower skirt frequency of the frequency range of RF filter 209, RF filtering circuit 209 may not be multiplexed with RF filter 209 when RF filtering circuit 207 outputs first frequency range 211. By employing the two branch circuits, RF filtering circuit 207 may output second frequency range 213, of which the upper skirt frequency is desirably lower than that of first frequency range 211 and has sufficient separation with the lower skirt frequency of the output frequency range of RF filter 209. RF filtering circuit 207 may then be multiplexed with Rf filter 209 by switching to a "reduced" output frequency range. In some embodiments, when RF filtering circuit 207 outputs first frequency range 211, RF filtering circuit 207 is multiplexed with RF filters 203 and 205, and RF filtering device 201 may be a triplexer. In some embodiments, when RF filtering circuit 207 outputs second frequency range 213, RF filtering circuit 207 is multiplexed with RF filter 209, and RF filtering device 201 may be a triplexer. In some embodiments, RF filter 203 outputs an ultra-high band frequency range, and RF filter 205 outputs a mid-band and high-band frequency range. RF filtering device 207 may output a Wi-Fi frequency range (e.g., first frequency range 211) or a reduced/trimmed Wi-Fi frequency range (e.g., second frequency range 213). In some embodiments, RF filter 209 outputs a satellite signal.

Figure 2D:
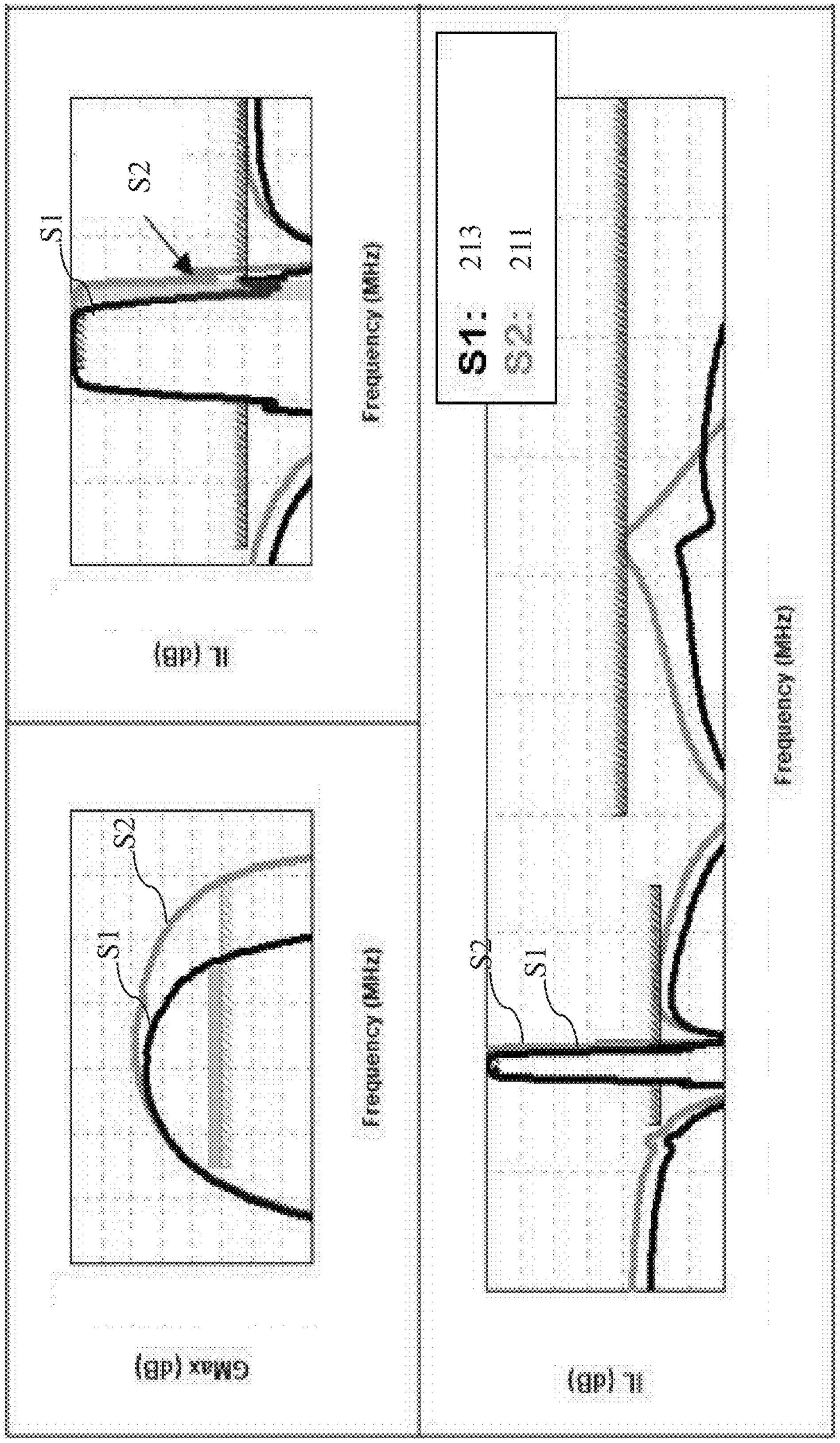
FIG. 2D illustrates transmission responses of the RF filtering device shown in FIG. 2C, according to some embodiments of the present disclosure.

FIG. 2D illustrates exemplary transmission responses of RF filtering device 201 as functions of frequencies. S1 represents second frequency range 213 (e.g., a reduced Wi-Fi frequency range), and S2 represents first frequency range 211 (e.g., a Wi-Fi frequency range). Compared to an existing RF filtering device that often includes an additional filter (e.g., with additional switches) to create separation between two frequency ranges for multiplexing, RF filtering device 201 uses fewer filters and switches, and offers a smaller and less costly option.

RF filtering circuit 200 may also be employed to achieve circuit rejection requirements. In some embodiments, the output of RF filtering circuit 200 may switch between first frequency range 211 and second frequency range 213, with the upper skirt frequency of first frequency range 211 being higher than that of second frequency range 213. RF filtering circuit 200 may then reject a frequency range beyond the upper skirt frequency of first frequency range 211. For example, the rejected frequency range may have a lower skirt frequency that is higher than the upper skirt frequency of first frequency range 211.

Figure 3A:
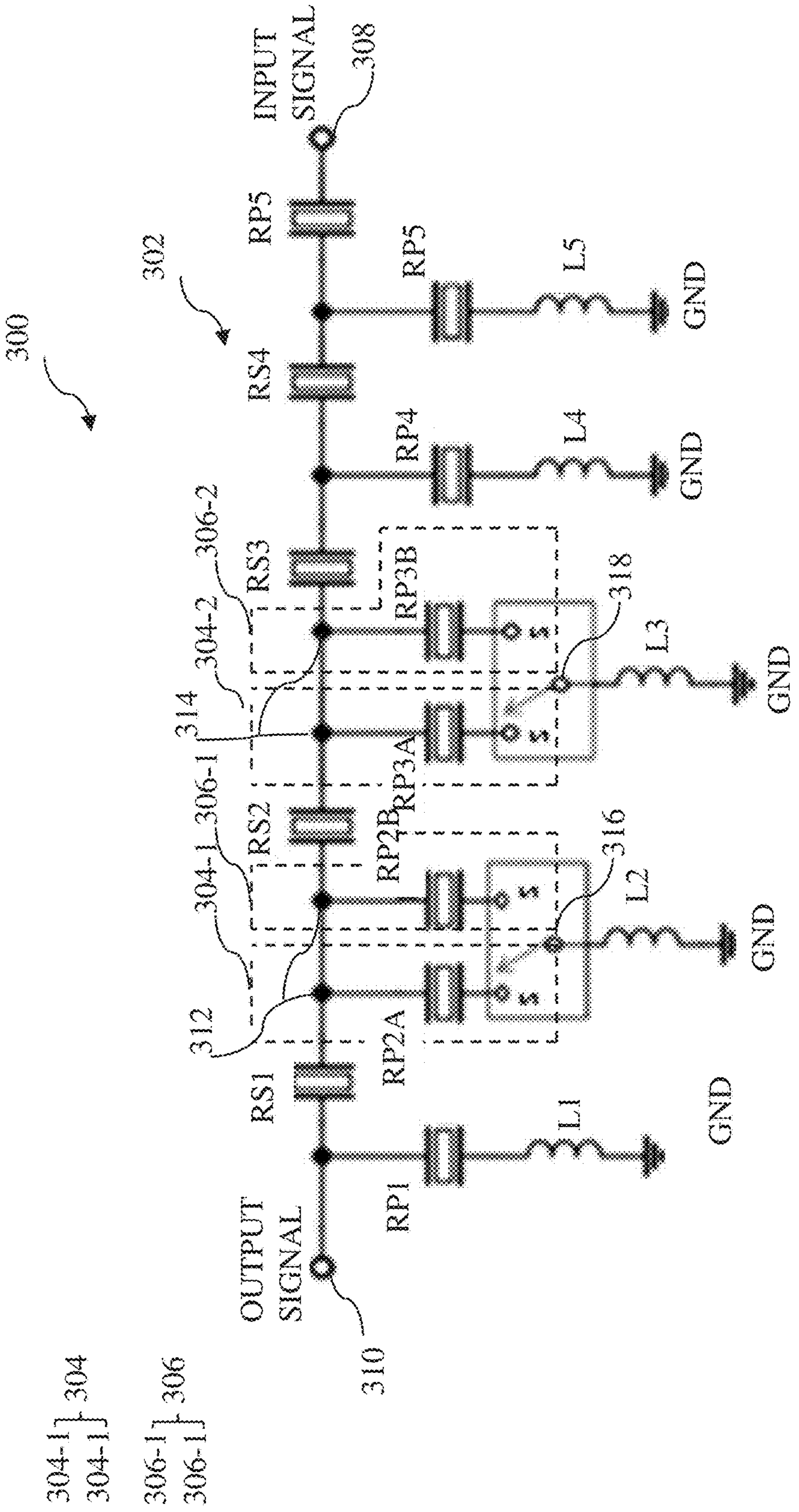
FIG. 3A illustrates another exemplary reconfigurable RF filtering circuit, according to some embodiments of the present disclosure.

FIG. 3A illustrates an exemplary RF filtering circuit 300 (e.g., a reconfigurable RF filtering circuit), according to some embodiments. RF filtering circuit 300 may have the configuration of RF filtering circuit 100. As shown in FIG. 3A, RF filtering circuit 300 may include a common circuit 302, a first branch circuit 304, a second branch circuit 306, and a pair of switches. A first terminal 308 of common circuit 302 may be an input terminal of RF filtering circuit 300 for receiving an input signal, and a second terminal 310 of common circuit 302 may be an output terminal of RF filtering circuit 300 for outputting an output signal. In some embodiments, the input signal is from a transmitter. In some embodiments, second terminal 310 may be electrically connected to an antenna. First branch circuit 304 and second branch circuit 306 may be coupled to common circuit 302 between first terminal 308 and second terminal 310. First and second branch circuits 304 and 306 may each be coupled to common circuit 302 at a third terminal 312 and a fourth terminal 314. RF filtering circuit 300 may also include a pair of common inductor L2 and L3 each being electrically coupled to the selected one of first and second branch circuits 304 and 306 in operation. L2 and L3 may be grounded.

Common circuit 302 may include at least one series resonator connected in series between first terminal 308 and second terminal 310. In some embodiments, common circuit 302 may include series resonators RS1, RS2, RS3, RS4, and RS5 connected in series. Common circuit 302 may also include at least one shunt resonator connected between a junction between first terminal 308 and second terminal 310, and a common terminal (e.g., ground or GND). In some embodiments, common circuit 302 includes shunt resonators RP1, RP4, and RP5, each respectively connected to a junction between two series resonators and ground. For example, shunt resonator RP1 may be connected between a junction coupled to second terminal 310 and ground, shunt resonator RP4 may be connected between a junction between series resonators RS3 and RS4 and ground, and shunt resonator RP5 may be connected between a junction between series resonators RS4 and RS5 and ground. In some embodiments, common circuit 202 includes inductors L1, L4, and L5 respectively connected to shunt resonators RP1, RP4, RP5, and ground.

First branch circuit 304 may include a first portion 304-1 connected to common circuit 302 at third terminal 312, and a second portion 304-2 connected to common circuit 302 at fourth terminal 314. Third terminal 312 may be a junction between series resonators RS1 and RS2, and fourth terminal 314 may be a junction between series resonators RS2 and RS3. First portion 304-1 may include a shunt resonator RP2A, and second portion 304-2 may include a shunt resonator RP3A.

Second branch circuit 306 may include a first portion 306-1 connected to common circuit 302 at third terminal 312, and a second portion 306-2 connected to common circuit 302 at fourth terminal 314. First portion 306-1 may include a shunt resonator RP2B, and second portion 306-2 may include a shunt resonator RP3B.

RF filtering circuit 300 may include a switch 316 coupled with a common inductor L2, and a switch 318 coupled with a common inductor L3. Common inductors L2 and L3 may be grounded. Switches 316 and 318 may also be configured to electrically connect one of first branch circuit 304 and second branch circuit 306 (e.g., the selected branch circuit) with the respective common inductors (e.g., L2 or L3) in operation. In some embodiments, when first branch circuit 304 is selected, switch 316 may electrically connect respective common inductor L2 with shunt resonator RP2A, and switch 318 may electrically connect respective common inductor L3 with shunt resonator RP3A. In some embodiments, when second branch circuit 306 is selected, switch 318 may electrically connect respective common inductor L3 with shunt resonator RP2B, and switch 318 may electrically connect respective common inductor L3 with shunt resonator RP3B.

First branch circuit 304 and second branch circuit 306 may correspond to different frequency ranges (or frequencies). The frequencies and/or resonating areas of the resonators in first branch circuit 304 and second branch circuit 306 may be adjusted/optimized to satisfy the frequency ranges of first and second branch circuits 304 and 306. In operation, one of first branch circuit 304 and second branch circuit 306 is selected such that switches 316 and 318 are electrically connected to the shunt resonators (e.g., RP2A and RP3A, or RP2B and RP3B) of the selected branch circuit (e.g., first branch circuit 304 or second branch circuit 306). An input signal may be received at first terminal 308 of common circuit 302, and may be processed by common circuit 302 and the selected branch circuit (e.g., first branch circuit 304 or second branch circuit 306). An output signal may be outputted by second terminal 310 of common circuit 302. In some embodiments, the output signal of RF filtering circuit 300 may be an input signal of an antenna.

Figure 3B:
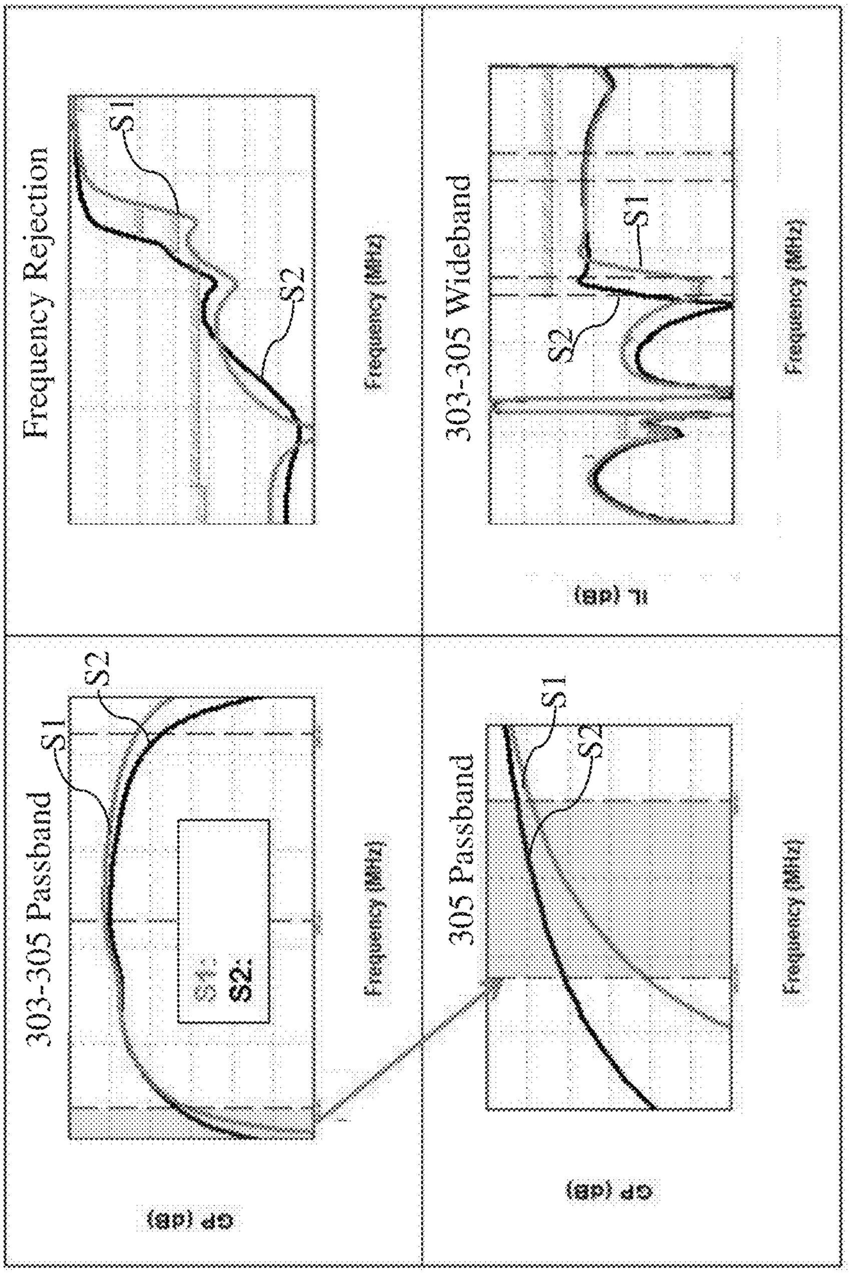
FIG. 3B illustrates transmission responses of the RF filtering circuit shown in FIG. 3A, according to some embodiments of the present disclosure.

Common circuit 302 may form a RF filter with each one of first and second branch circuits 304 and 306. For example, when first branch circuit 304 is selected, common circuit 302 and first branch circuit 304 may form a first RF filter, which outputs a first frequency range (e.g., as output signal S1). When second branch circuit 306 is selected, common circuit 302 and second branch circuit 306 may form a second RF filter, which outputs a second frequency range (e.g., as output signal S2). In some embodiments, the first frequency range and the second frequency range may overlap and may have different lower skirt frequencies. FIG. 3B illustrates exemplary transmission responses of RF filtering circuit 230 as functions of frequencies. As shown in FIG. 3B, the lower skirt frequency of the first frequency range (e.g., as output signal S1) and the lower skirt frequency of second frequency range (e.g., as output signal S2) may be different. In various embodiments, the resonating areas and/or frequencies of the resonators in RF filtering circuit 300 can be adjusted/optimized to obtain a desirable separation between the lower skirt frequencies of first and second frequency ranges. First branch circuit 304 and second branch circuit 306 may be selected (e.g., turned on or off) based on the frequency coverage desired.

In some embodiments, the first frequency range and second frequency range have the same upper skirt frequency, and different lower skirt frequencies. For example, the lower skirt frequency of the first frequency range (e.g., output signal S1) is lower than the lower skirt frequency of the second frequency range (e.g., output signal S2). In some embodiments, the upper skirt frequencies of the first frequency range and the second frequency range may also be different.

It should be noted that, RF filtering circuit 300 is merely an example to show the impact of switching shunt resonators in different branch circuits on the lower skirt frequencies, and is not meant to limit the number and electrical connections in a branch circuit or a common circuit. In various embodiments, a RF filtering circuit similar to RF filtering circuit 300 (e.g., having the configuration of RF filtering circuit 100) may have a different number of branch circuits, and each branch circuit may have a different number of shunt resonators than RF filtering circuit. The similar RF filtering circuit may also be configured to adjust the lower skirt frequencies and/or loading impedance at the output terminal by switching amongst different branch circuits with different shunt resonators (e.g., corresponding to different frequencies, having different resonating areas, etc.). The specific number of branch circuits may be determined based on the tuning range of the output frequency range and is not limited by the embodiments of the present disclosure.

Figure 4A:
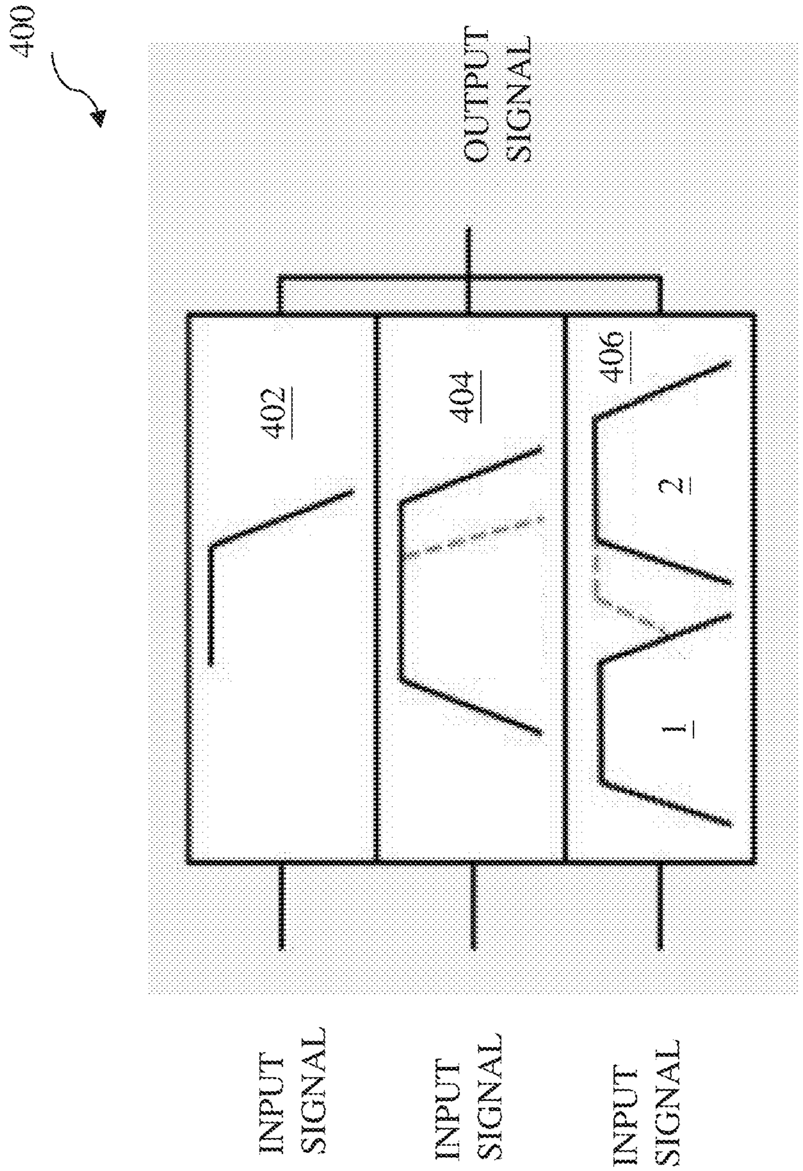
FIG. 4A illustrates an exemplary RF device implemented with exemplary reconfigurable RF filtering circuits, according to some embodiments of the present disclosure.

RF filtering circuits 200 and 300 can be used separately or in combination to achieve desirable filtering needs. FIG. 4A illustrates a RF filtering device 400, according to some embodiments. RF filtering device 400 may be a switchplexer and may include a RF filter 402, a RF filtering circuit 404, and a RF filter circuit 406. Each of the RF filtering circuits 404 and 406 and RF filter 402 may have a respective input terminal for receiving a respective input signal. In some embodiments, the input signals are from one or more transmitters. The output signal of a selected one of the RF filtering circuits 404 and 406 and RF filter 402 may be outputted to an antenna. In some embodiments, RF filtering circuit 404 is a band-pass filter and outputs a pass-band. In some embodiments, RF filtering circuit 406 is a notch filter and outputs a stop-band.

Figure 4B:
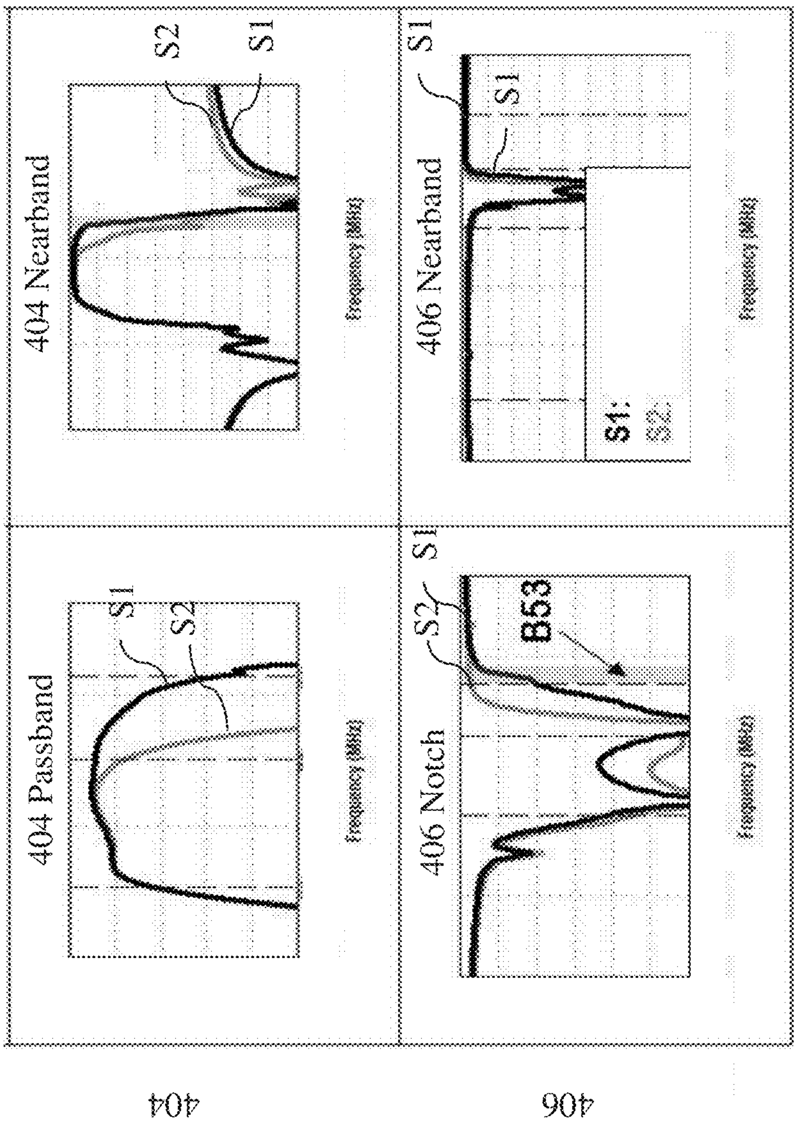
FIG. 4B illustrates transmission responses of the RF device shown in FIG. 4A, according to some embodiments of the present disclosure.

RF filtering circuit 200 (or similar) may be employed to adjust the upper skirt frequency of the pass-band. In some embodiments, RF filtering circuit 404 may include RF filtering circuit 200 (or similar) to output a first frequency range (e.g., a first pass-band signal) or a second frequency range (e.g., a second pass-band signal). The upper skirt frequency of the output pass-band signal can be adjusted by adjusting the series resonators in RF filtering circuit 404. In some embodiments, the upper skirt frequency of the second frequency range is lower than the upper skirt frequency of the first frequency range, and the lower skirt frequencies of the first and second frequency ranges are the same. For ease of illustration, the upper skirt of the second frequency range is shown as the dashed line as an example. In some embodiments, The first frequency range is a Wi-Fi pass-band, and the second frequency range is a reduced Wi-Fi pass-band. FIG. 4B illustrates transmission responses of the first frequency range (e.g., signal "S1") and second frequency range (e.g., signal "S2") as functions of frequencies.

RF filtering circuit 300 (or similar) and/or RF filtering circuit 200 may be employed to adjust the width of the stop-band. For example, RF filtering circuit 300 may be employed to adjust the lower skirt frequency of the upper pass-band in a notch filter. RF filtering circuit 406, e.g., a notch filter, may include a first pass-band 1 and a second pass-band 2, forming a stop-band between the upper skirt of first pass band 1 and the lower skirt of second pass band 2. In some embodiments, RF filtering circuit 406 may include RF filtering circuit 300 (or similar) to output a first frequency range (e.g., a pass-band) or a second frequency range (e.g., a pass-band) for second pass-band 2. The lower skirt frequency of second pass-band 2 can be adjusted by adjusting the shunt resonators in RF filtering circuit 406. In some embodiments, the lower skirt frequency of the second frequency range is lower than the lower skirt frequency of the first frequency range, and the upper skirt frequencies of the first and second frequency ranges are the same. In some embodiments, by switching between the first and second frequency ranges, the lower skirt of bass-band 2 can be adjusted for a broader stop-band or a narrower stop-band, between first pass-band 1 and second pass-band 2. For ease of illustration, the lower skirt of the second frequency range is shown as the dashed line as an example. In some embodiments, The pass-bands 1 and 2 are each a mid-band and high-band signal. FIG. 4B illustrates transmission responses of the first frequency range (e.g., signal "S1") and second frequency range (e.g., signal "S2") as functions of frequencies.

In addition to tuning frequency ranges, reconfigurable RF filtering circuits can also be used for multiplexer load tuning. When a single RF filter is multiplexed, it experiences different loading when connected to different multiplexer components, and vice versa. This is because that each multiplexer combines different number of RF filters, and hence has different effective capacitive loading. To minimize the difference in loading, in existing multiplexers, duplicates of the "single" filter and external matching elements (e.g., inductors and/or capacitors) are used. In an application in which multiple multiplexers are coupled to an antenna, the use of a reconfigurable RF filtering circuit can be used to minimize loading difference amongst multiplexers, and reduce/eliminate the need for external matching elements which often have relatively low quality factors. In this case, the series or shunt resonator on the antenna side of the reconfigurable RF filtering circuit is split into branches, with each branch being used for a particular multiplexing combination.

Figure 5:
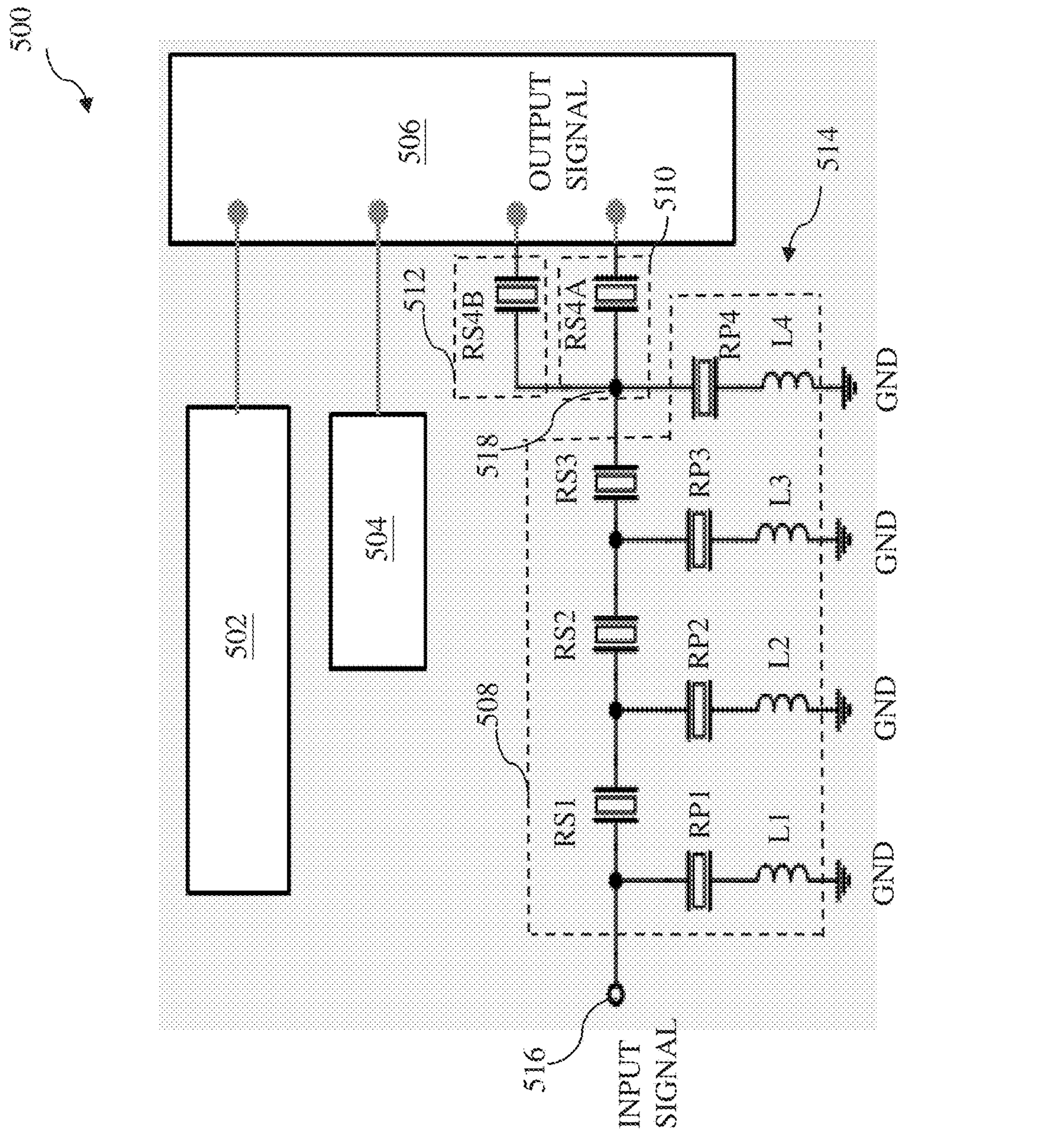
FIG. 5 illustrates another exemplary RF device implemented with a reconfigurable RF filtering circuit, according to some embodiments of the present disclosure.

FIG. 5 illustrates a RF filtering device 500 including a plurality of multiplexers and a RF filtering circuit 514, each electrically coupled to an antenna 506, according to some embodiments. RF filtering device 500 may include a first multiplexer 502, a second multiplexer 504, and a RF filtering circuit 514, each electrically coupled to antenna 506. First multiplexer 502 and second multiplexer 504 may be different, and may have different loading impedance (e.g., capacitive loading impedance) to antenna 506. For example, first multiplexer 502 may be a hexaplexer that combines six frequency bands/ranges, and second multiplexer 504 may be a diplexer that combines two frequency bands/ranges. Output terminals of first multiplexer 502 and second multiplexer 504 are electrically coupled to input terminals of antenna 506.

RF filtering circuit 514 may include a common circuit 508, a first branch circuit 510, and a second branch circuit 512. A first terminal 516 of common circuit 508 is configured to receive an input signal, and a second terminal 518 of common circuit 508 is coupled to first branch circuit 510 and second branch circuit 512. In some embodiments, the input signal is from a transmitter. In some embodiments, common circuit 508 include a plurality of series resonators (e.g., RS1, RS2, and RS3) connected in series between first terminal 516 and second terminal 518. Common circuit 508 may also include a plurality of shunt resonators (e.g., RP1, RP2, RP3, and RP4) each connected to a junction between first and second terminals 516 and 518, and a common terminal (e.g., ground/GND). In some embodiments, common circuit 508 also includes a plurality of inductors (e.g., L1, L2, L3, and L4) each coupled between ground and a respective shunt resonator, as shown in FIG. 5.

First branch circuit 510 may include a series resonator RS4A connected to second terminal 518 and an input terminal of antenna 506. Second branch circuit 512 may include a series resonator RS4B connected to second terminal 518 and another input terminal of antenna 506. In some embodiments, antenna 506 includes a switch (not shown) that can electrically connect one of first branch circuit 510 and second branch circuit 512 with antenna 506, in operation. Common circuit 508 may form a first RF filter with first branch circuit 510, and form a second RF filter with second branch circuit 512. In some embodiments, series resonator RS4A is different from series resonator RS4B such that the first RF filter and the second RF filter have different loading impedances to antenna 506. For example, the loading impedance of the first RF filter matches the loading impedance of first multiplexer 502, and the loading impedance of the second RF filter matches the loading impedance of second multiplexer 504. In an example, RS4A may have a smaller resonating area than that of RS4B such that RS4A has lower capacitive loading than RS4B.

Figure 6:
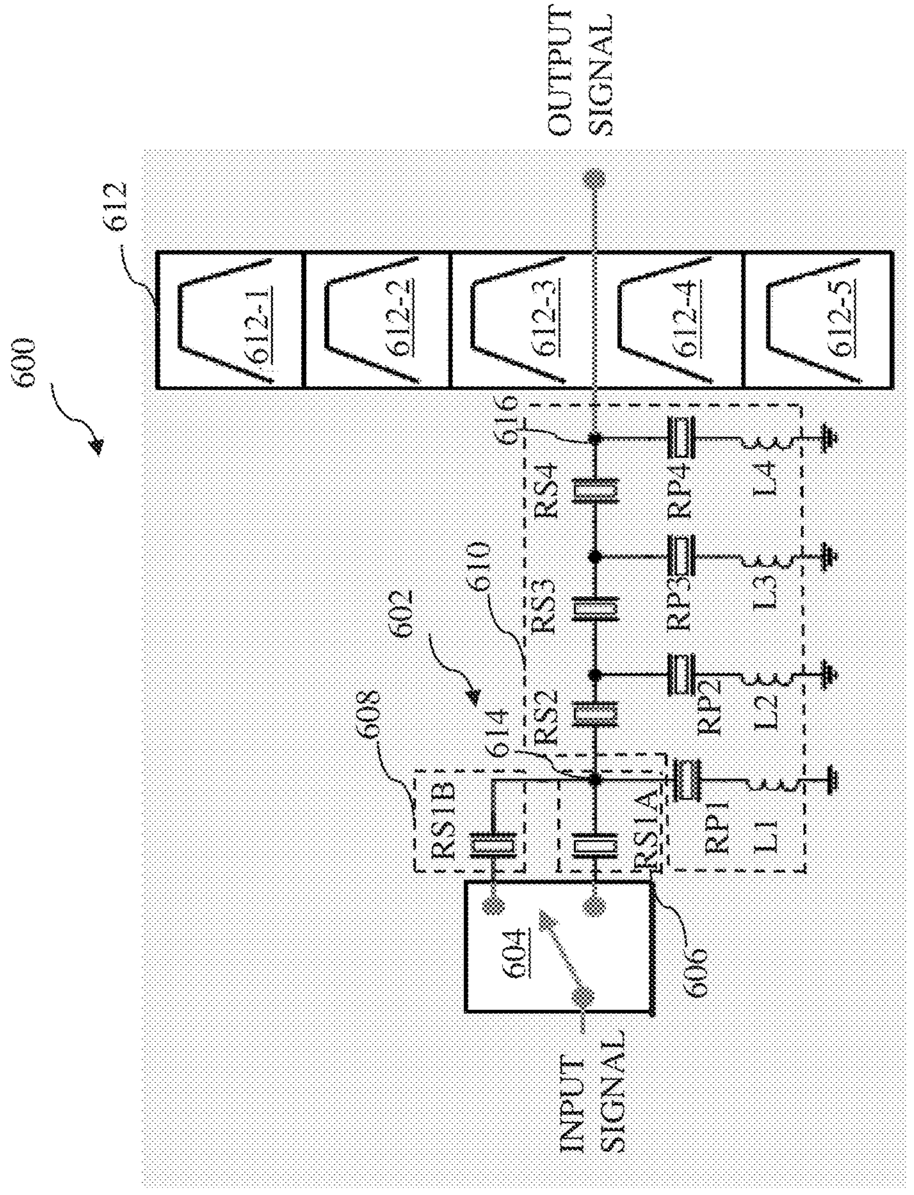
FIG. 6 illustrates another exemplary RF device implemented with a reconfigurable RF filtering circuit, according to some embodiments of the present disclosure.

FIG. 6 illustrates a RF filtering device 600 including a RF filtering circuit 602 multiplexed with a multiplexer 612, according to some embodiments. The multiplexed signal may then be transmitted to an antenna (not shown). In some embodiments, multiplexer 612 may be a hexaplexer that combines six frequency bands/ranges (e.g., 612-1, 612-2, 612-3, 612-4, 612-5, and 612-6). Multiplexer 612 may be multiplexed with an output signal of RF filtering circuit 602, and an output terminal of multiplexer 612 is electrically coupled to an input terminal of antenna 612. Different from RF filtering circuit 514, RF filtering circuit 602 has a configuration of RF filtering circuit 101. Instead of switching amongst different branch circuits at the antenna side, the branch circuits of RF filtering circuit 602 may be positioned between the input signal and the common circuit. In some embodiments, the input signal is from a transmitter. RF filtering device 600 may include a switch 604 that electrically couples the input terminal of RF filtering circuit 602 with one of the branch circuits. By having the switch further away from the antenna, the switching losses of RF filtering device 600 can be minimized while the loading impedance of multiplexer 612 is matched with RF filtering circuit 602.

RF filtering circuit 602 may include a first branch circuit 606, a second branch circuit 608, and a common circuit 610. First branch circuit 606 may include a series resonator RS1A connected to a first terminal 614 of common circuit 610. Second branch circuit 608 may include a series resonator RS1B connected to first terminal 614 of common circuit 610. Switch 604 may electrically couple the input terminal of RF filtering circuit 602 with first branch circuit 606 or second branch circuit 608 in operation.

Common circuit 610 may include a plurality of series resonators (e.g., RS1, RS2, RS3, and RS4) connected in series between first terminal 614 and a second terminal 616. Common circuit 610 may also include a plurality of shunt resonators (e.g., RP1, RP2, RP3, and RP4) each connected to a junction between first and second terminals 614 and 616, and a common terminal (e.g., ground/GND). In some embodiments, common circuit 610 also includes a plurality of inductors (e.g., L1, L2, L3, and L4) each coupled between ground and a respective shunt resonator, as shown in FIG. 6.

Common circuit 610 may form a first RF filter with first branch circuit 606, and form a second RF filter with second branch circuit 608. In some embodiments, series resonator RS4A is different from series resonator RS4B such that the first RF filter and the second RF filter have different loading impedances to the antenna. For example, the loading impedance of the first RF filter matches the loading impedance of filter 612-1, and the loading impedance of the second RF filter matches the loading impedance of filter 612-2. The output signal of multiplexer 612, after multiplexing with RF filtering circuit 602, may be an input of the antenna.

It should be noted that, the RF filtering circuits in the present disclosure are merely examples. In various embodiments, the number of branch circuits in an RF filtering circuit can be greater than 2, depending on the number of frequency ranges or loading impedances the RF filtering circuit is configured to switch amongst. The specific number of branch circuits in a RF filtering circuits should not be limited by the embodiments of the present disclosure.

The invention claimed is:

1. A radio frequency (RF) filtering circuit, comprising:

a common circuit comprising one or more first series resonators in series between an input terminal and an output terminal, and one or more first shunt resonators each electrically connected between a junction between the input terminal and the output terminal, and a common terminal;

a first branch circuit electrically connected to the common circuit, the first branch circuit comprising a second shunt resonator electrically connected to the common circuit at a third terminal, and a fourth shunt resonator electrically connected to the common circuit at a fourth terminal, the second shunt resonator being different from the fourth shunt resonator;

a second branch circuit electrically connected to the common circuit, the second branch circuit comprising a third shunt resonator electrically connected to the common circuit at the third terminal, and a fifth shunt resonator electrically connected to the common circuit at the fourth terminal, the third shunt resonator being different from the fifth shunt resonator; and one or more switches comprising a first switch and a second switch positioned between the input terminal and the output terminal and electrically connected to one of the first branch circuit or the second branch circuit, wherein:

in response to the one or more switches being electrically coupled to the first branch circuit, the first switch electrically connects the second shunt resonator with a first inductor, and the second switch electrically connects the fourth shunt resonator with a second inductor; and in response to the one or more switches being electrically coupled to the second branch circuit, the first switch electrically connects the third shunt resonator with the first inductor, and the second switch electrically connects the fifth shunt resonator with the second inductor; and wherein, the first branch circuit is different from the second branch circuit.

2. The RF filtering circuit of claim 1, wherein:

in response to the one or more switches being electrically coupled to the first branch circuit, the output terminal outputs a first frequency range; and in response to the one or more switches being electrically coupled to the second branch circuit, the output terminal outputs a second frequency range, the second frequency range being different from the first frequency range.

3. The RF filtering circuit of claim 2, wherein the first branch circuit and the second branch circuit are each electrically connected to the common circuit at a third terminal between the input terminal and the output terminal.

4. The RF filtering circuit of claim 3, wherein:

the one or more switches are positioned between the third terminal and the output terminal; and the one or more switches electrically connect the first branch circuit to the output terminal, or electrically connect the second branch circuit to the output terminal.

5. The RF filtering circuit of claim 3, wherein the first branch circuit corresponds to an upper skirt frequency of the first frequency range; and the second branch circuit corresponds to an upper skirt frequency of the second frequency range, the upper skirt frequencies of the first frequency range and the second frequency range being different from one another.

6. The RF filtering circuit of claim 5, wherein the first frequency range and the second frequency range at least partially overlap with each other.

7. The RF filtering circuit of claim 2, wherein the first branch circuit corresponds to a lower skirt frequency of the first frequency range; and the second branch circuit corresponds to a lower skirt frequency of the second frequency range, the lower skirt frequencies of the first frequency range and the second frequency range being different from one another.

8. The RF filtering circuit of claim 7, wherein the first frequency range and the second frequency range at least partially overlap with each other.

9. The RF filtering circuit of claim 3, wherein:

the one or more switches and the output terminal are part of an antenna;

the first branch circuit comprises one second series resonator electrically connected to the common circuit at the third terminal;

the second branch circuit comprises one third series resonator electrically connected to the common circuit at the third terminal; and the second series resonator is different from the third series resonator such that a first loading impedance of the first branch circuit is different from a second loading impedance of the second branch circuit.

10. The RF filtering circuit of claim 1, wherein the one or more first series resonators, the one or more first shunt resonators, the second shunt resonator, and the third shunt resonator comprise at least one of a bulk acoustic wave (BAW) resonator or a surface acoustic wave (SAW) resonator.

* * * * *